United States Patent
Kanazawa et al.

[11] Patent Number: 6,040,962
[45] Date of Patent: Mar. 21, 2000

[54] MAGNETORESISTIVE ELEMENT WITH CONDUCTIVE FILMS AND MAGNETIC DOMAIN FILMS OVERLAPPING A CENTRAL ACTIVE AREA

[75] Inventors: Kiyosumi Kanazawa, Nagano; Yoshiro Nakagawa, Yamanashi, both of Japan

[73] Assignee: TDK Corporation, Tokyo, Japan

[21] Appl. No.: 09/078,484

[22] Filed: May 14, 1998

[30] Foreign Application Priority Data

May 14, 1997 [JP] Japan .................................. 9-124563

[51] Int. Cl.[7] ......................................................... G11B 5/39
[52] U.S. Cl. ............................................................... 360/113
[58] Field of Search .................................... 360/113, 126; 324/252; 338/32 R

[56] References Cited

U.S. PATENT DOCUMENTS

| | | | |
|---|---|---|---|
| 4,024,489 | 5/1977 | Bajorek et al. ................... | 338/32 R |
| 5,018,037 | 5/1991 | Krounbi et al. ................... | 360/113 |
| 5,438,470 | 8/1995 | Ravipati et al. ................... | 360/113 |
| 5,641,557 | 6/1997 | Ishiwata ............................ | 360/113 |
| 5,646,805 | 7/1997 | Shen et al. ........................ | 360/113 |
| 5,701,221 | 12/1997 | Taniyama et al. ................ | 360/113 |
| 5,739,988 | 4/1998 | Gill .................................... | 360/113 |
| 5,739,990 | 4/1998 | Ravipati et al. .................. | 360/113 |
| 5,748,416 | 5/1998 | Tobise et al. ..................... | 360/113 |
| 5,754,376 | 5/1998 | Kobayashi et al. ............... | 360/113 |
| 5,805,389 | 9/1998 | Saito et al. ........................ | 360/113 |
| 5,847,904 | 12/1998 | Bharthulwar ..................... | 360/113 |
| 5,876,843 | 3/1999 | Ishiwata ............................ | 428/209 |

FOREIGN PATENT DOCUMENTS

| | | |
|---|---|---|
| 3-125311 | 5/1991 | Japan . |
| 8-045037 | 2/1996 | Japan . |

*Primary Examiner*—Jefferson Evans
*Attorney, Agent, or Firm*—Oblon, Spivak, McClelland, Maier & Neustadt, P.C.

[57] ABSTRACT

The present invention is directed to an MR element and a thin film magnetic head that do not cause an increase in the electrical resistance value due to the presence of dead zones. When forming passive areas that include magnetic domain control films and conductive films at the two sides of a central active area through a vacuum film formation method, the magnetic domain control films are formed under film forming conditions that are different from the film forming conditions under which the conductive films are formed to ensure that the degree to which the conductive films overlap the central active area is set larger than the degree to which the magnetic domain control films overlap the central active area.

22 Claims, 8 Drawing Sheets

MAGNETORESISTIVE ELEMENT WITH CONDUCTIVE FILMS AND MAGNETIC DOMAIN FILMS OVERLAPPING A CENTRAL ACTIVE AREA

BACKGROUND OF THE INVENTION

1. Field of the Invention

The present invention relates to a magnetoresistive element (hereafter referred to as an MR element), a thin film magnetic head and a method for manufacturing thereof.

2. Description of the Prior Art

As the current demand dictates a trend for miniaturization of magnetic disk drive apparatuses, thin film magnetic heads that employ an MR element as a read element are known in the prior art as magnetic converters that are suited for reading information stored on a magnetic recording medium at a high recording density since the output is not dependent upon its speed relative to the magnetic disk.

An example of a magnetic conversion element employed in a thin film magnetic head is disclosed in Japanese Unexamined Patent Publication No.125311/1991. The magnetoresistive reader disclosed in this publication is provided with a central active area and a pair of passive areas. The central active area includes a magnetoresistive film (hereafter referred to as an MR film), a non-magnetic film and a soft magnetic film, with the soft magnetic film imparting a lateral bias to the MR film. The pair of passive areas each include a magnetic domain control film and a conductive film. The magnetic domain control films are laminated at the two ends of the central active area facing opposite each other over a distance with the conductive films provided on top of the magnetic domain control films.

The soft magnetic film included in the central active area applies a lateral bias to the MR film, thereby assuring linear operation when reading magnetically recorded data. When the magnetic field generated from the magnetically recorded data on the magnetic recording medium is applied to the MR film in the direction intersecting the direction of magnetization of the MR film, the direction of magnetization of the MR film changes. Thus, the resistance value of the MR film changes in correspondence to the change in the direction of magnetization, resulting in a sense current corresponding to the magnetically recorded data. Since, when the magnetic field generated from the magnetically recorded data on the magnetic recording medium matches the direction of magnetization of the MR film, the direction of magnetization does not change and the resistance value of the MR film does not change significantly.

The magnetic domain control films are provided to prevent Barkhausen noise by applying a longitudinal bias to the MR film. U.S. Pat. No. 4,024,489 discloses an MR sensor that employs a hard magnetic bias film as a magnetic domain control film.

In the MR element described above, since no lateral bias is applied due to the strong longitudinal bias applied by the magnetic domain control film in the vicinity of the areas where the magnetic domain control films contact the MR film, dead zones are formed.

A dead zone does not function as a sensor and increases the electrical resistance value in the magnetoresistive sensor circuit. If the electrical resistance at the magnetoresistive sensor circuit increases, its performance as a magnetoresistive sensor circuit is degraded. Furthermore, the risk of electromigration occuring due to high density current increases.

As a means for reducing the electrical resistance value, which increases because of the dead zones, conductive films are provided adjoining the central active area at both sides beyond the dead zones. Since dead zones are formed uniformly at the two side ends of the MR film, it is necessary to form the conductive films uniformly at the edges of the MR film at the two sides. Without such uniformity, the electrical resistance value will still increase due to the non-operating areas and the magnetic reliability of the MR film under the conductive films, which is operable, will deteriorate.

U.S. Pat. No. 5,438,470 discloses a structure achieved by placing only a conductive film on the central active area and a structure achieved by placing a magnetic domain control film and a conductive film over areas of equal dimensions on the central active area. However, in the structure achieved by placing only the conductive film over the central active area, a difficulty of accurately aligning the side end surface of the magnetic domain control film with the side end surfaces of the central active area must be overcome in production. In addition, the structure achieved by placing the magnetic domain control film and the conductive film over areas of equal dimensions on the central active area poses the problem discussed in the reference to patent specification cited earlier.

Furthermore, U.S. Pat. No. 5,438,470 discloses a structure in which uniformity is achieved at the two edges of the MR film in the degree to which the conductive films overlap at the two ends of the central active area. However, in the patent no mention is made as to the specific means for achieving uniformity for the overlapping dimensions of the conductive films.

SUMMARY OF THE INVENTION

It is an object of the present invention to provide an MR element and a thin film magnetic head that do not induce an increase in the electrical resistance value due to the presence of dead zones and a method for manufacturing them.

In order to achieve the object described above, the MR element according to the present invention includes a central active area and passive areas. The passive areas are provided at the two side ends of the central active area, each having a magnetic domain control film and a conductive film.

The magnetic domain control film is partially overlapped with the surface of the central active area. The conductive film is laminated onto the surface of the magnetic domain control film to overlap the surfaces of the magnetic domain control film and the central active area. The degree to which the conductive film overlaps the surface of the central active area is larger than the degree to which the magnetic domain control film overlaps the surface of the central active area.

By setting the degree to which the conductive film overlaps the central active area larger than the degree to which the magnetic domain control film overlaps the central active area, the dead zones formed due to the presence of the magnetic domain control films at the two side ends of the central active area are, in effect, electrically bypassed by the conductive films to prevent an increase in the electrical resistance value in the magnetoresistive sensor circuit.

Furthermore, according to the present invention, the difficult task of accurately aligning the side end surfaces of the magnetic domain control films with the side end surfaces of the central active area during production can be avoided.

As a means for setting the degree to which the conductive films overlap the central active area to be larger than that of the magnetic domain control films, a method in which the magnetic domain control films and the conductive films are formed under different film forming conditions is adopted in the present invention. Through this film formation method, the magnetic domain control films and the conductive films can be formed separately to achieve uniformity at the two ends of the MR film while also achieving appropriate overlapping dimensions.

The film forming conditions that may be selected include vacuum film formation methods such as sputtering, deposition and a combination thereof. Since smaller overlapping dimensions are achieved with deposition compared to sputtering, the magnetic domain control films may be formed through deposition and the conductive films may be formed through sputtering to create a difference between the overlapping dimensions of the magnetic domain control films and the conductive films. In addition, the conductive films can be formed uniformly at the two ends of the MR film.

Even when only sputtering is implemented, differing film forming conditions such as the presence/absence of rotation of the substrate, the position of the substrate, the sputter gas pressure, the distance from the sputtering gate to the substrate and the like can be set, and by optimizing those film forming conditions, the magnetic domain control films and the conductive films can be formed separately to achieve uniformity at the two ends of the MR film while also achieving appropriate overlapping dimensions.

The manufacturing method according to the present invention may be adopted in manufacturing the MR element in the method for manufacturing the thin film magnetic head according to the present invention. Consequently, the same advantages as those achieved when manufacturing an MR element according to the present invention can be achieved in the production of a thin film magnetic head.

BRIEF DESCRIPTION OF THE DRAWINGS

More specific features and advantages of the present invention are explained in further detail in reference to the drawings, wherein.

DETAILED DESCRIPTION OF THE PREFERRED EMIBODIMENTS

Figure 1:
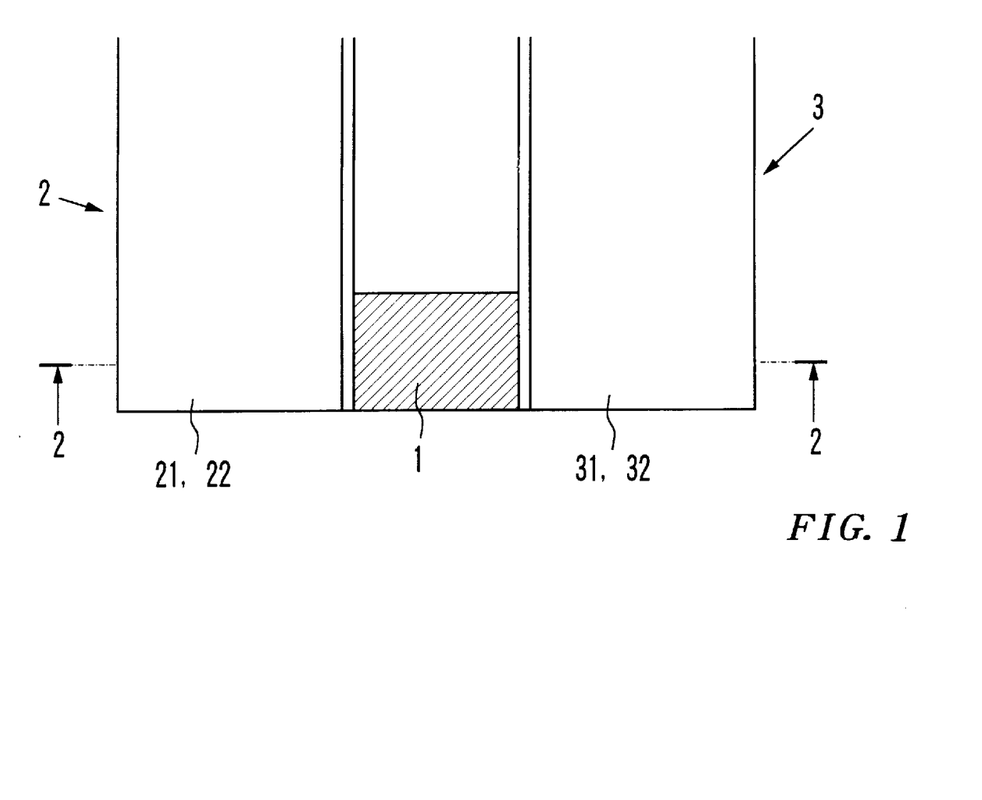
FIG. 1 is a plan view of an MR element achieved through the manufacturing method according to the present invention.
Figure 2:
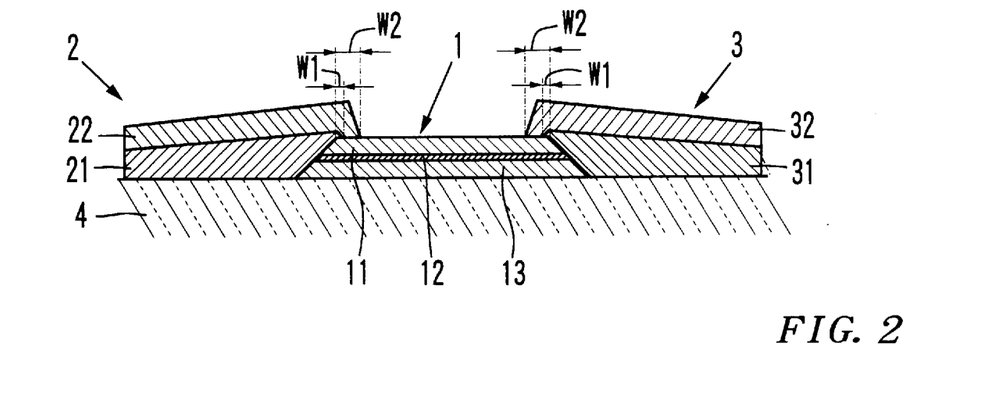
FIG. 2 is a cross section through line 2—2 in FIG. 1.

Referring to FIGS. 1 and 2, the MR element according to the present invention comprises a central active area 1 and passive areas 2 and 3, and is supported by a substrate 4. The central active area 1 includes an MR film 11, a non-magnetic film 12 and a soft magnetic film 13 (see FIG. 2). The soft magnetic film 13 applies a lateral bias to the MR film 11, and constitutes the lowermost layer on the substrate 4 in the figure. The non-magnetic film 12 is laminated on the soft magnetic film 13. The MR film 11 is laminated on the non-magnetic film 12. The MR film 11 maybe constituted of, for instance, Permalloy. Its composition, thickness, method of manufacture and the like are known to persons of ordinary knowledge in the relevant technical field. The soft magnetic film 13 is a magnetic film constituted of, for instance, Ni—Fe—Rh, Ni—Fe—Cr or an amorphous substance and imparts little or no magnetoresistance. It is formed to achieve a film thickness of, for instance, 50 to 300 Å. The non-magnetic film 12 may be constituted of a Ta film having a film thickness of 50 to 200 Å, for instance. This laminated structure is normally employed for this type of MR element. A four-layer structure achieved by sequentially laminating the soft magnetic film 13, the non-magnetic film 12 and the MR film 11 and further laminating a Ta film having a film thickness of approximately 10 to 50 Å on the MR film 11 is another structural example that is adopted when employing a magnetic anisotropic MR film 11 in the known art.

In the central active area 1, a spin valve film, a GMR film constituted of a ferromagnetic tunnel film or the like may be used instead of the film constituted of the magnetic anisotropic MR film 11 described above.

The passive areas 2 and 3, which are adjoined to the central active area 1 at its two side surfaces, supply a sense current to the central active area 1 or apply the required magnetic bias. The passive areas 2 and 3 include magnetic domain control films 21 and 31 respectively, which apply a longitudinal bias to the MR film 11.

The magnetic domain control films 21 and 31 may be constituted of hard magnetic film. In that case, by utilizing the magnetic fields generated by the hard magnetic films 21 and 31 that have been polarized, a consistent longitudinal bias can be applied to the MR film 11 to prevent generation of Barkhausen noise caused by movement of the magnetic domain. The hard magnetic films, which may be constituted of, for instance, CoPt, may be formed to achieve a film thickness of, for instance, approximately 200 Å.

Alternatively, the magnetic domain control films 21 and 31 may be constituted of an antiferromagnetic film. In that case, by taking advantage of the antiferromagnetism-ferromagnetism exchange coupling generated between the ferromagnetic films and the MR film 11 to apply a consistent longitudinal bias to the MR film 11, Barkhausen noise caused by movement of the magnetic domain can be prevented. The antiferromagnetic films, which may be constituted of, for instance, Fe—In or Ni—Mn, are formed to have a film thickness of, for instance, approximately 200 Å. When constituting the magnetic domain control films 21 and 31 with an antiferromagnetic film, it is necessary to provide a ferromagnetic film under them.

In addition to the magnetic domain control films 21 and 31, the passive areas 2 and 3 are respectively provided with conductive films 22 and 32. The conductive films 22 and 32 are applied onto the magnetic domain control films 21 and 31 respectively, having patterns that overlap the magnetic domain control films 21 and 31 on the areas of the central active area 1. Because of this, the sense current can be supplied to the central active area 1 mainly through the conductive films 22 and 32 at the two ends of the central active area 1. The conductive films 22 and 32 may be constituted of, for instance, a laminated film comprising TiW/Ta.

As explained earlier, there are dead zones that do not contribute to the sensor function in the vicinity of the areas where the magnetic domain control films 21 and 31 adjoin the MR film 11. The longitudinal bias applied by the magnetic domain control films 21 and 31 is intense and, consequently, no lateral bias is applied. Thus, since the dead zones do not contribute to the sensor function, an increase in the electrical resistance value at the magnetoresistive sensor circuit results, which impedes the performance of the magnetoresistive sensor circuit and amplifies the risk of electromigration occurring due to a high density current.

As a means for reducing the electrical resistance value which increases due to the presence of the dead zones, according to the present invention, the dimensions W2 over which the conductive films 22 and 32 overlap the central active area 1 are set larger than the dimensions W1, over which the magnetic domain control films 21 and 31 overlap the central active area 1. The overlapping dimensions W1 and W2 refer to the degree to which the magnetic domain control films 21 and 31 and the conductive films 22 and 32 overlap at the surface of the central active area 1 (see FIG. 2).

By setting the dimension W2 over which the conductive films 22 and 32 overlap the central active area larger than the overlapping dimension W1 of the magnetic domain control films 21 and 31, the dead zones formed by the presence of the magnetic domain control films 21 and 31 at the two ends of the central active area 1 are essentially electrically bypassed by the conductive films 22 and 32, to prevent an increase in electrical resistance value at the magnetoresistive sensor circuit.

The overlapping dimension W2 at which the conductive films 22 and 32 overlap the surface of the central active area 1 is consistent at the two side ends of the central active area 1.

The overlapping areas of the conductive films 22 and 32 over the surface of the central active area 1 must extend beyond the dead zones formed at the central active area. The size of the dead zones depends upon the product of the residual magnetic flux density of the magnetic domain control films 21 and 22 and their film thickness, and normally extends approximately 0.15 to 0.5 $\mu$m measured from the side end surfaces of the central active area 1. Consequently, the overlapping dimension W2 of the conductive films 22 and 32 on the central active area 1 should be set at a value exceeding a range of approximately 0.15 to 0.5 $\mu$m under normal circumstances. It goes without saying that the overlapping dimension W2 should be changed in correspondence to any changes in the value of the dead zones.

The distance between the conductive film 22 and the conductive film 32 must be set to achieve the required track width in an application in a magnetic head. As a result, the maximum value of the overlapping dimension W2 in this case, will be subject to restrictions imposed by the track width.

According to the present invention, the magnetic domain control films 21 and 31 are allowed to partially overlap the central active area over an overlapping dimension W1. Consequently, the difficult task of accurately aligning the side end services of the magnetic domain control films 21 and 31 with the side end surfaces of the central active area 1 can be avoided.

In order to achieve the MR element illustrated in FIGS. 1 and 2, according to the present invention, the magnetic domain control films 21 and 31 and the conductive films 22 and 32 are formed under different film forming conditions. Through this film formation method, the magnetic domain control films 21 and 31 and the conductive films 22 and 32 can be formed separately to achieve uniformity at the two ends of the MR film 11 while also achieving appropriate overlapping dimensions W1 and W2. Next, in reference to the attached drawings, specific examples of the film formation methods according to the present invention are explained.

Figure 3:
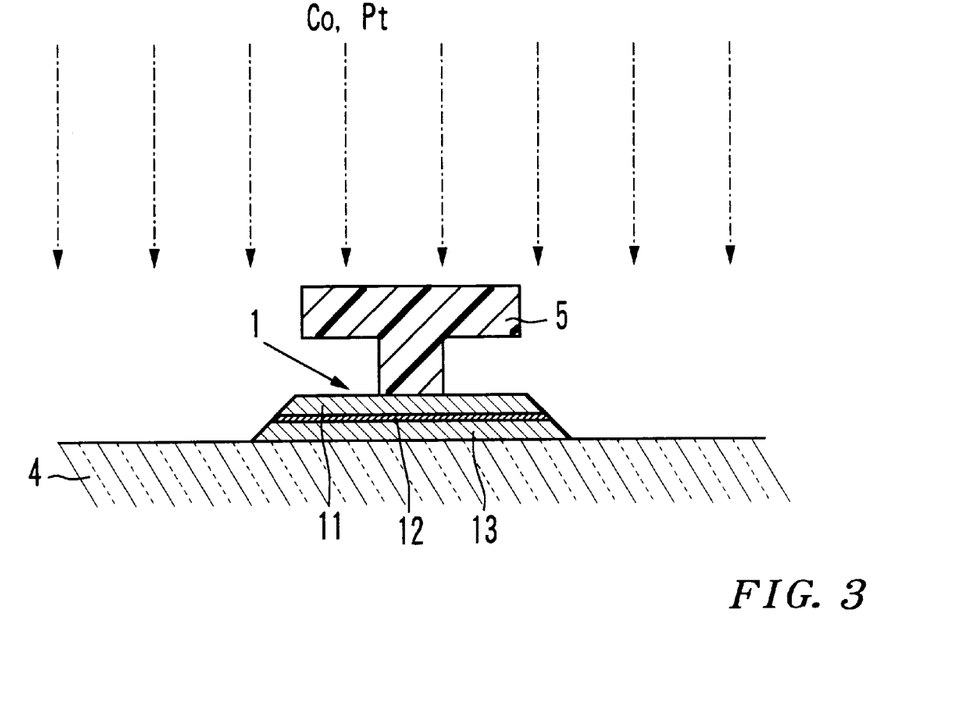
FIG. 3 illustrates a manufacturing process for achieving the MR element shown in FIGS. 1 and 2.
Figure 4:
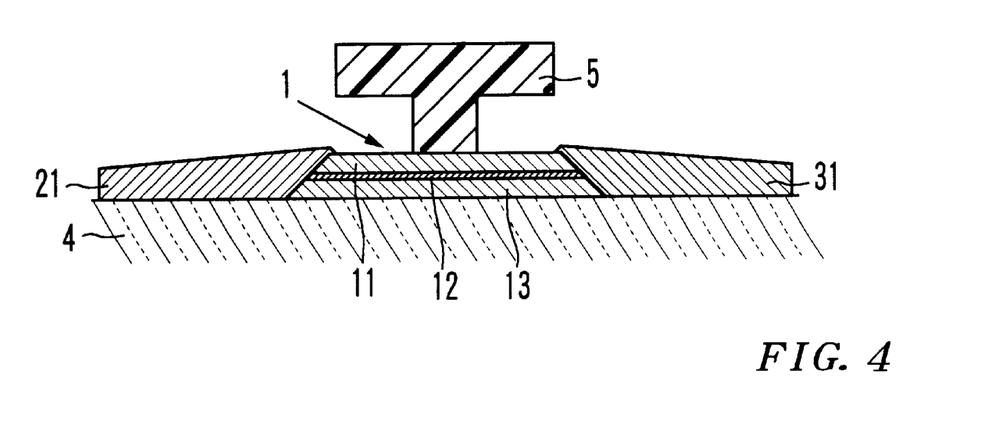
FIG. 4 illustrates the state achieved when the process illustrated in FIG. 3 is completed.

First, FIGS. 3 and 4 illustrate examples in which sputtering is employed as a vacuum film formation method. In FIG. 3, the central active area 1 is already formed on one surface of the substrate 4. The central active area 1 may be formed by employing any of the technologies that have already been proposed or technologies that will be proposed in the future. At the substrate 4, which, under normal circumstances will be a wafer, many central active areas 1 are formed and arrayed on one surface. A mask 5 is provided over the central active areas 1. The mask 5 in the figures is constituted of a resist film resulting from a lift-off operation performed when forming the central active areas 1.

The magnetic domain control films 21 and 31 are formed through sputtering under film forming conditions in which atoms that enter the one surface of the substrate 4 in the perpendicular direction are mainly employed, as shown in FIG. 3. When the magnetic domain control films 21 and 31 are constituted of CoPt, as illustrated in FIGS. 1 and 2, the Co and Pt atoms that enter in the perpendicular direction relative to the one surface of the substrate 4 are used for forming the magnetic domain control films 21 and 31. Since the Co atoms and the Pt atoms that enter in the perpendicular direction relative to the one surface of the substrate 4 are mainly utilized, the overlapping dimension W1 of the magnetic domain control films 21 and 31 is extremely small, as illustrated in FIG. 4.

Figure 5:
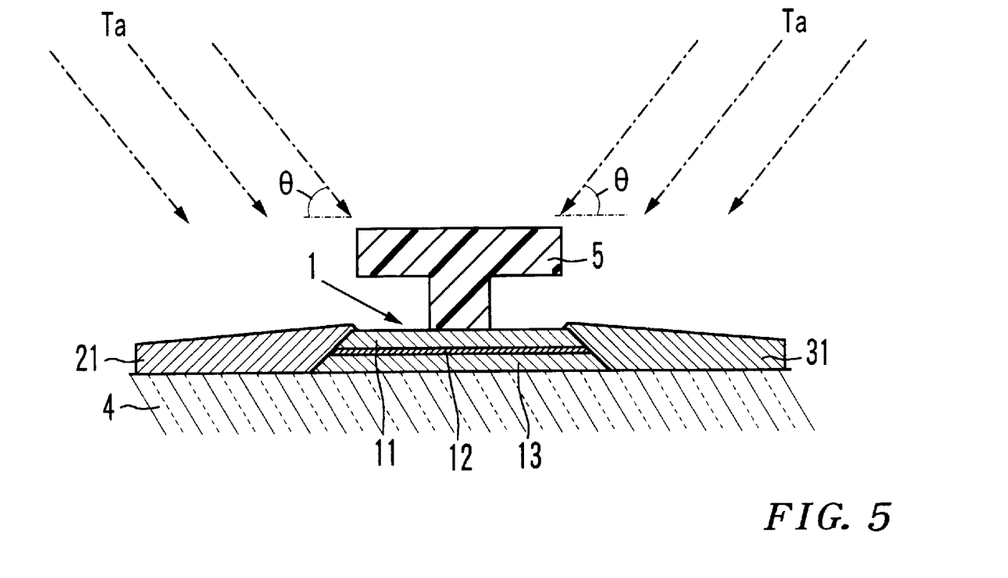
FIG. 5 illustrates the process that follows the process illustrated in FIGS. 3 and 4.

When the film formation process in which the magnetic domain control films 21 and 31 are formed, as shown in FIGS. 3 and 4, is completed, the conductive films 22 and 32 are formed using mainly atoms that enter in a diagonal direction at an angle $\theta$ relative to the one surface of the substrate 4 as illustrated in FIG. 5. When the conductive films 22 and 32 are to be constituted of laminated film of TiW/Ta, first the TiW film is formed and then the Ta film is formed through sputtering. Since the conductive films 22 and 32 are formed through sputtering by mainly using atoms that enter in a diagonal direction relative to the one surface of the substrate 4, the overlapping dimension W2 of the conductive films 22 and 32 is set larger than the overlapping dimension W1 of the magnetic domain control films 21 and 31 (see FIG. 6). With this structure, since the dead zones caused by the presence of the magnetic domain control films 21 and 31 at the two ends of the central active area 1 can be essentially electrically bypassed with the conductive films 22 and 32, an increase in the electrical resistance value at the magnetoresistive sensor circuit is avoided.

Figure 6:
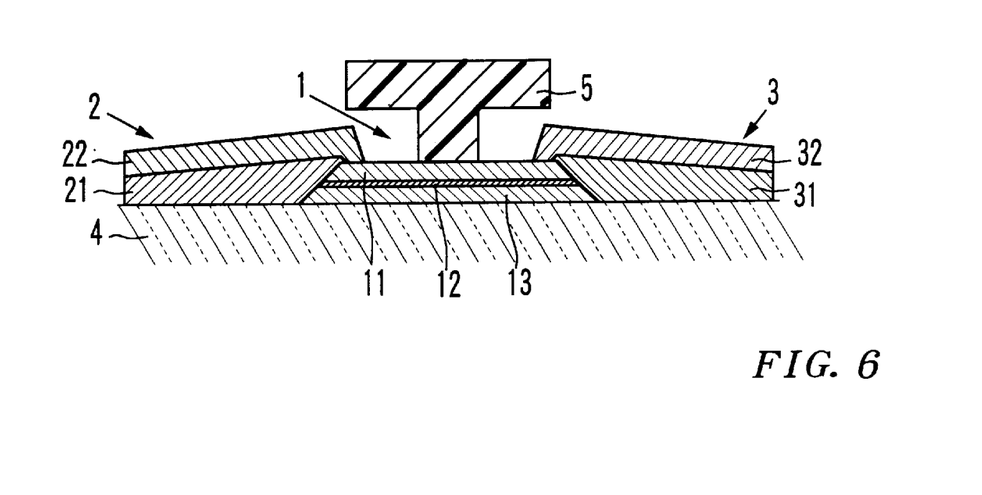
FIG. 6 illustrates the state achieved when the process illustrated in FIG. 5 is completed.
Figure 7:
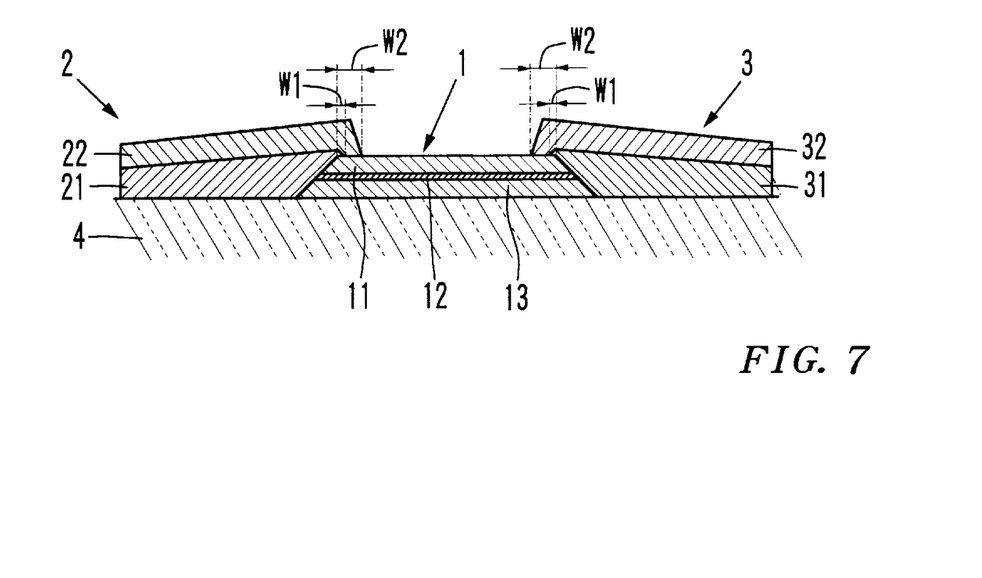
FIG. 7 illustrates the process that follows the process illustrated in FIGS. 5 and 6.

Furthermore, through the film formation method explained above, the magnetic domain control films 21 and 31 and the conductive films 22 and 32 can be formed individually so that they are formed uniformly at the two ends of the MR film 11 achieving ideal overlapping dimensions W1 and W2 respectively. Thus, the conductive films 22 and 32 are formed uniformly at the two ends of the MR film 11 to reliably prevent an increase in the electrical resistance value which would otherwise result from non-uniformity, and reliably prevent any reduction in the magnetic reliability of the operable MR film 11 under the conductive films 22 and 32. When the conductive film formation process illustrated in FIGS. 5 and 6 is completed, the mask 5 is removed (see FIG. 7).

Figure 8:
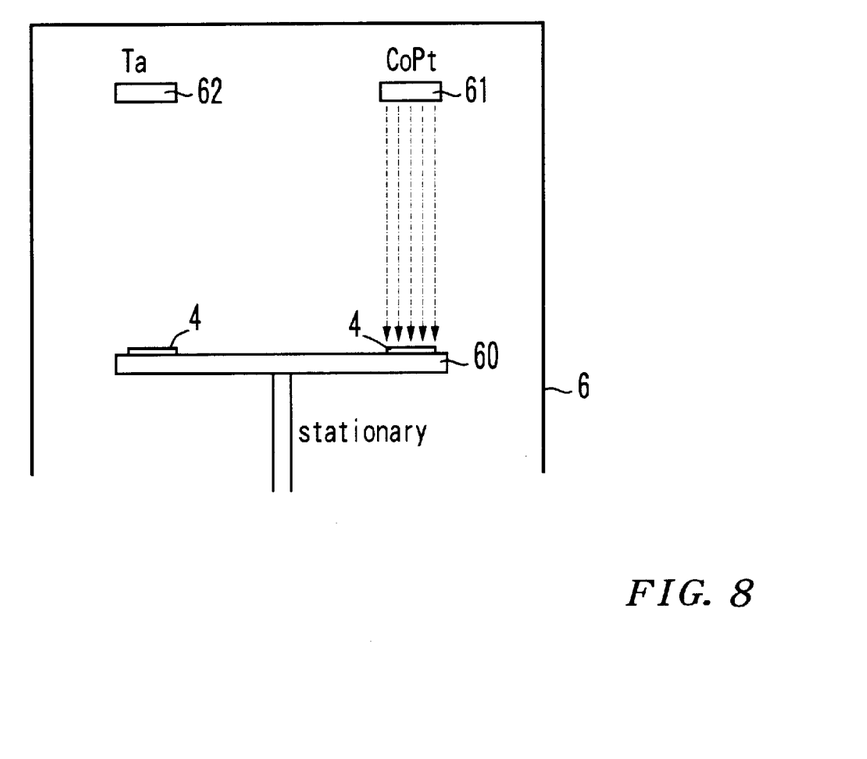
FIG. 8 is a schematic illustration of an example of the manufacturing method according to the present invention.
Figure 9:
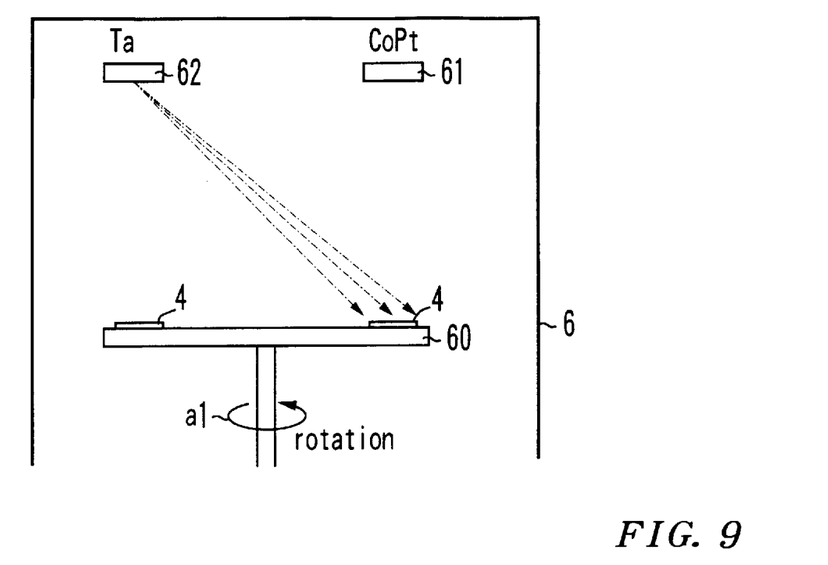
FIG. 9 is a schematic illustration of the process that follows the process illustrated in FIG. 8.

FIGS. 8 and 9 illustrate another embodiment. In this embodiment, too, sputtering is employed as a vacuum film formation method. The substrate 4 with the central active area formed on one of its surfaces is mounted on a rotating plate 60. The rotating plate 60 is driven to rotate in the direction indicated by the arrow (a1) by a drive apparatus (not shown). We shall refer to such rotation of the rotating plate 60 as rotation. On the rotating plate 60, a target 61 for Co and Pt and a target 62 for Ta are provided. The rotating plate 60 and the targets 61 and 62 are provided inside a vacuum film formation chamber 6.

First, the magnetic domain control films are formed through a stationary film formation method in which the rotating plate 60 is not rotating, as illustrated in FIG. 8. Thus, the magnetic domain control films are formed through sputtering, using mainly atoms that enter in the perpendicular direction relative to the one surface of the substrate 4.

Next, as illustrated in FIG. 9, the conductive films are formed through sputtering by employing a rotating film formation method in which the rotating plate 60 is caused to rotate in the direction indicated by the arrow (a1). Thus, the conductive films are formed through sputtering, using mainly the atoms that enter in a diagonal direction relative to the one surface of the substrate 4 to achieve larger overlapping dimensions for the conductive films than the overlapping dimensions of the magnetic domain control films.

In addition, the overlapping dimensions of the magnetic domain control films and the conductive films can be adjusted by changing the distances of the target 61 and the target 62 from the substrate 4. In order to ensure that the overlapping dimensions of the conductive films are larger than the overlapping dimensions of the magnetic domain control films, the distance of the target 61 from the substrate 4 is set larger than the distance of the target 62 from the substrate 4 under normal circumstances.

Figure 10:
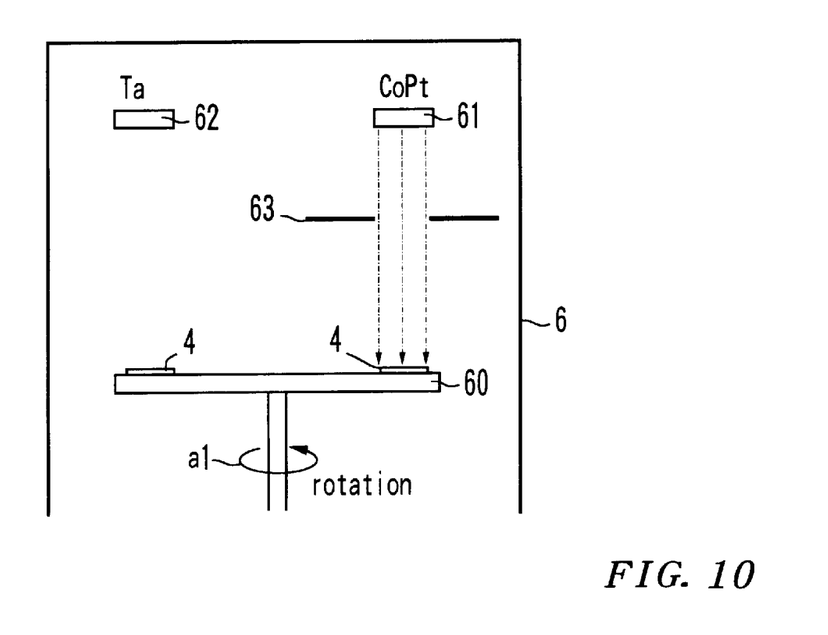
FIG. 10 is a schematic illustration of another example of the manufacturing method according to the present invention.
Figure 11:
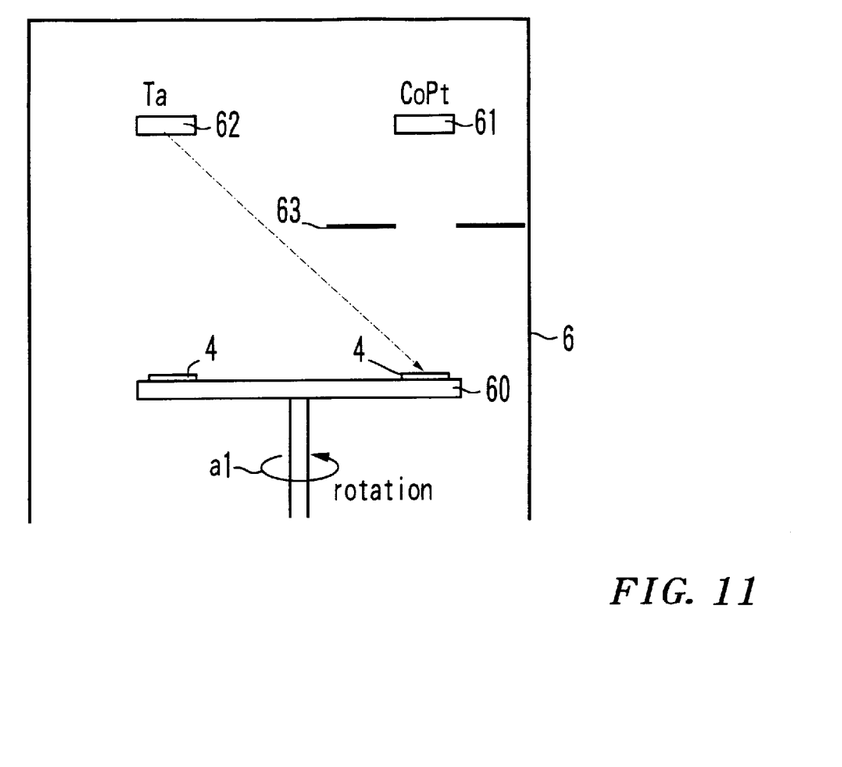
FIG. 11 is a schematic illustration of the process that follows the process illustrated in FIG. 10.

FIGS. 10 and 11 illustrate yet another embodiment of the manufacturing method according to the present invention. In this embodiment, too, sputtering is employed as a vacuum film formation method. The substrate 4 having a central active area formed on one surface thereof is mounted on the rotating plate 60. The magnetic domain control films are formed by combining the aperture effect achieved by a mask 63 and a rotating film formation method in which the rotating plate 60 is caused to rotate, as illustrated in FIG. 10. Since, even when the rotating plate 60 is rotating, the aperture effect achieved by the mask 63 is still obtained, the magnetic domain control films are formed through sputtering, using mainly atoms that enter in the perpendicular direction relative to the one surface of the substrate 4.

Next, the conductive films are formed by adopting the rotating film formation method in which the rotating plate 60 is caused to rotate, as illustrated in FIG. 11.

Figure 12:
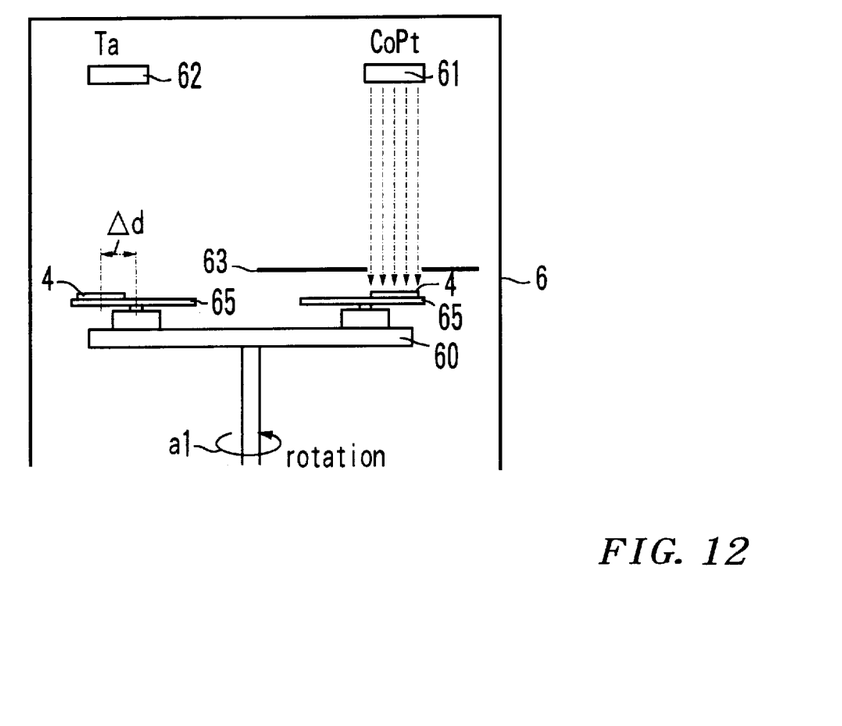
FIG. 12 is a schematic illustration of another example of the manufacturing method according to the present invention.
Figure 13:
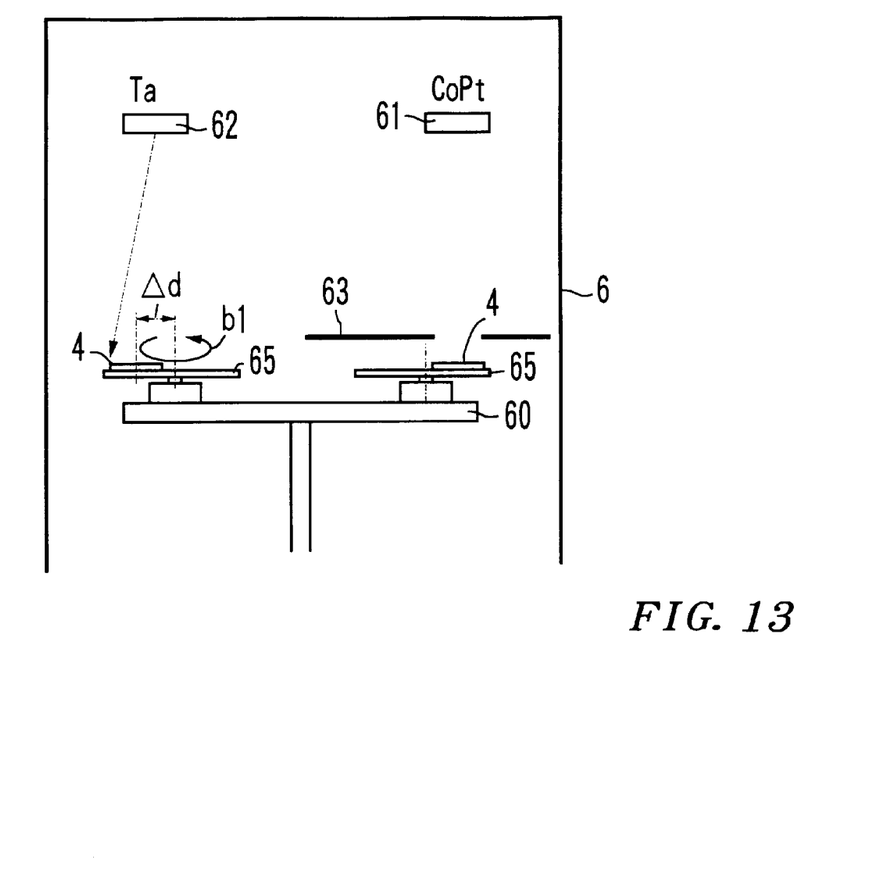
FIG. 13 is a schematic illustration of the process that follows the process illustrated in FIG. 12.

FIGS. 12 and 13 illustrate yet another embodiment of the manufacturing method according to the present invention. Sputtering is again employed as a vacuum film formation method. In this embodiment, a first rotating plate 60 and a second rotating plate 65 are provided. The second rotating plate 65 is located on the first rotating plate 60, at a position offset from the center of its rotation. The first rotating plate 60 rotates in the direction indicated by the arrow a1 whereas the second rotating plate 65 rotates independently in the direction indicated by the arrow (b1) (see FIG. 13). The substrate 4 at which the central active area is already formed, is provided on one surface of the second rotating plate 65, offset by Δd from the center of rotation of the second rotating plate 65.

First, the magnetic domain control films are formed by combining the aperture effect achieved through the mask 63 and the rotating film formation method in which the first rotating plate 60 is caused to rotate, as illustrated in FIG. 12. Since, even when the first rotating plate 60 is rotating, the aperture effect by the mask 63 is still obtained, magnetic domain control films are formed through sputtering using mainly the atoms that enter in the perpendicular direction relative to the one surface of the substrate 4.

Next, the conductive films are formed by employing a rotating film formation method in which the second rotating plate 65 is caused to rotate independently in the direction indicated by the arrow (b1) while the rotation of the first rotating plate 60 is stopped, as illustrated in FIG. 13. Since the substrate 4 is provided on the one surface of the second rotating plate 65, offset by Δd from the center of the rotation of the second rotating plate 65, the conductive films are formed through sputtering, using mainly the atoms that enter in a diagonal direction relative to the one surface of the substrate 4 to set the overlapping dimensions of the conductive films larger than the overlapping dimensions of the magnetic domain control films.

Figure 14:
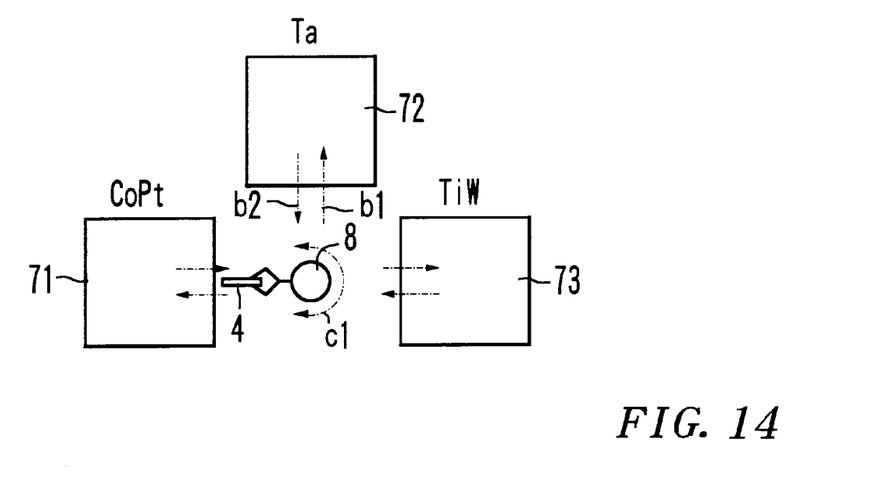
FIG. 14 is a schematic illustration of another example of the manufacturing method according to the present invention.

FIG. 14 illustrates yet another embodiment of the manufacturing method according to the present invention. This embodiment is characterized in that the magnetic domain control films and the conductive films are formed in separate vacuum film formation chambers 71 to 73. The substrate 4 with the central active area formed in advance is moved in and out of the vacuum film formation chambers 71 to 73 by a robot 8 or the like. In an embodiment in which the magnetic domain control films are constituted of CoPt and the conductive films are constituted of TiW/Ta, the vacuum film formation chamber 71 for CoPt film formation, the vacuum film formation chamber 72 for Ta film formation and the vacuum film formation chamber 73 for TiW film formation are provided. The robot 8, which is driven in the direction indicated by the arrow (c1), moves the substrate 4 in and out of the vacuum film formation chambers 71 to 73 in conformance to the film formation sequence. The number of vacuum film formation chambers provided must correspond to the number of films to be formed. The film forming conditions that may be selected for the vacuum film formation chambers 71 to 73 include vacuum film formation methods such as sputtering, deposition and a combination thereof. Since smaller overlapping dimensions are achieved through deposition compared to those achieved through sputtering, the magnetic domain control films may be formed at the vacuum film formation chamber 71 through deposition and the conductive films at the vacuum film formation chambers 72 and 73 may be formed through sputtering. Thus, a difference is created between the overlapping dimensions of the magnetic domain control films and the overlapping dimensions of the conductive films. In addition, the conductive films can be formed uniformly at the two ends of the MR film.

Now, a specific embodiment is explained. Table 1 presents data achieved when the films are formed by adopting the film formation method illustrated in FIGS. 8 and 9.

TABLE 1

| Conditions | Film | |
|---|---|---|
| | CoPt | Ta |
| Film formation method | Sputtering | Sputtering |
| Substrate stationary/rotating | Stationary | Rotating |
| Substrate offset | None | None |
| Sputter gas (Pa) | 0.1 | 0.5 |
| Distance between substrate and target | 150 | 70 |
| Overlapping dimensions (W1, W2) | 0.1 | 0.3 |

According to the data presented in Table 1, while the overlapping dimension of the magnetic domain control films constituted of CoPt is 0.1 $\mu$m, the overlapping dimension of the conductive films constituted of Ta is 0.3 $\mu$m. In Table 1, the optimal overlapping dimensions 0.1 $\mu$m and 0.3 $\mu$m for dead zones of 0.2 $\mu$m measured at one end of the central active area, are presented. By changing the film forming conditions, optimal overlapping dimensions W1 and W2 that are ideal for various dead zone dimensions can be achieved.

Figure 15:
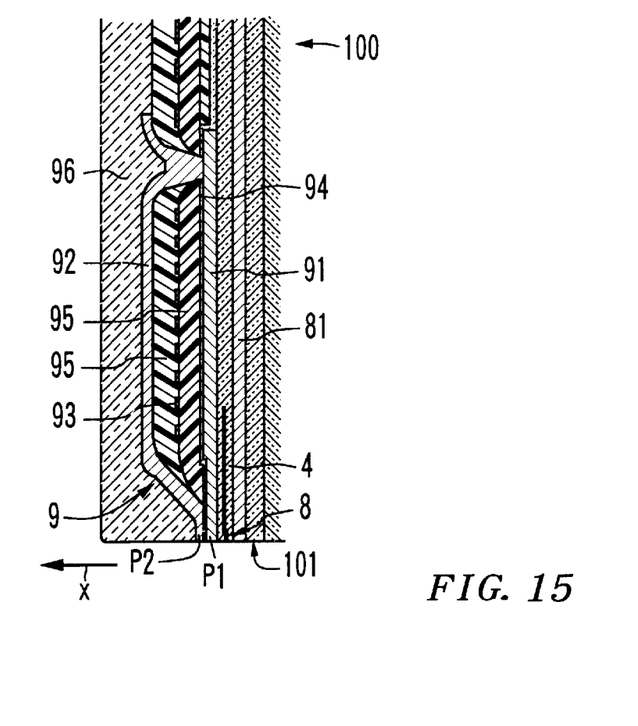
FIG. 15 is an enlarged cross section of a thin film magnetic head achieved through the manufacturing method according to the present invention.
Figure 16:
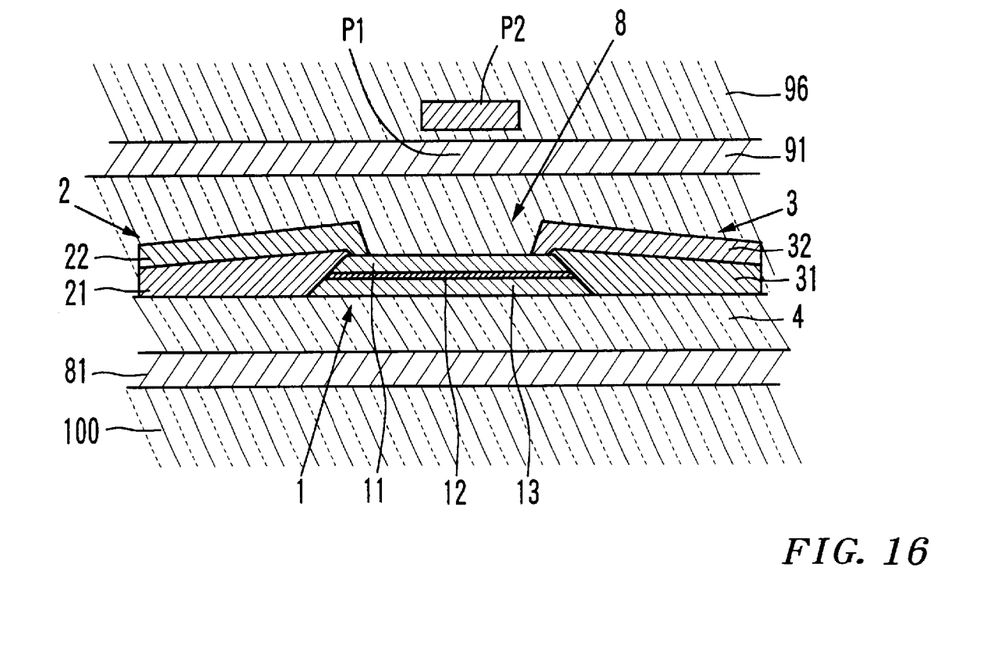
FIG. 16 is an enlarged cross section showing the portion of the thin film magnetic head in FIG. 15 where the magnetic conversion elements are provided.

FIG. 15 is a cross section of a thin film magnetic head which employs the MR element described above as a read element and an inductive element as a write element. FIG. 16 is an enlarged cross section of the portion of the thin film magnetic head in FIG. 15 where the magnetic conversion elements are provided.

The thin film magnetic head in the figures is provided with a read element 8 constituted of the MR element and a write element 9 constituted of an inductive element both located on a slider 100.

In the slider 100, which is constituted of a ceramic structure, an insulating film constituted of Al$_2$O$_3$, SiO$_3$ or the like is provided on a substrate constituted of Al$_2$O$_3$—TiC or the like. The slider 100 is provided with an air bearing surface (hereafter referred to as an ABS surface) 101 at one of its surfaces that faces opposite the magnetic disk. The slider 100 may be of the type in the known art which utilizes the surface of a rail portion provided at the surface facing opposite the magnetic disk as an ABS surface or of the type in the known art which utilizes almost the entirety of the flat surface facing opposite the magnetic disk with no rail portion formed thereupon as an ABS surface.

The read element 8 is embedded in the form of a film inside the insulating film 4. Reference number 81 indicates a first shield film which is constituted of a magnetic film such as Sendust, Permalloy or iron nitride. The read element 8 is provided with a second shield film 91 which is constituted of a magnetic film such as Permalloy or iron nitride.

The read element 8 is constituted of an MR element achieved through the manufacturing method according to the present invention described earlier. Consequently, a thin film magnetic head having an MR element which does not cause an increase in the electrical resistance value due to the presence of dead zones is achieved.

The write element 9 is provided with a first magnetic film 91 that also functions as the second shield film, a second magnetic film 92, a coil film 93, a gap film 94 constituted of alumina or the like, an insulating film 95 constituted of an organic resin such as Novolak resin and a protective film 96, and is laminated on top of the insulating film 4. The front end portions of the first magnetic film 91 and the second magnetic film 22 constitute pole tips P1 and P2 respectively, which face opposite each other across the gap film 94 with a very small thickness, and write is performed at the pole tips P1 and P2 for a magnetic disk (not shown) that moves at high speed in the direction indicated by the arrow X. The first magnetic film 91 and the second magnetic film 92 are linked with each other in such a manner that their yokes complete a magnetic circuit at a back gap portion which is on the opposite side from the pole tips P1 and P2. The coil film 93 is formed on the insulating film 95, winding around the connecting area of the yoke in a coil. The write element 9 shown in the figure simply represents an example, and the write element 9 may adopt a structure other than this particular structure.

What is claimed is:

1. A magnetoresistive element comprising:
   a central active area; and
   passive areas provided at two side ends of said central active area, each passive area including a magnetic domain control film and a conductive film;
   wherein said magnetic domain control film of each passive area partially overlaps the surface of said central active area, each conductive film is laminated onto a surface of a respective magnetic domain control film and overlaps surfaces of said respective magnetic domain control film and said central active area, and the degree to which said conductive films overlap said surface of said central active area is set larger than the degree to which said magnetic domain control films overlap said surface of said central active area.

2. The magnetoresistive element of claim 1 wherein said degree to which said conductive films overlap the surface of said central active area is uniform at said two side ends of said central active area.

3. The magnetoresistive element of claim 1 wherein an overlapping area of said conductive films on said surface of said central active area extends beyond respective dead zones formed at said central active area.

4. The magnetoresistive element of claim 3 wherein said respective dead zones extend over approximately 0.3 to 1 $\mu$m.

5. The magnetoresistive element of claim 1 wherein said central active area includes a magnetic anisotropic magnetoresistive film.

6. The magnetoresistive element of claim 5 wherein said magnetic domain control film of said passive areas includes an anti-ferromagnetic film and applies a longitudinal bias to said magnetic anisotropic magnetoresistive film by utilizing anti-ferromagnetic/ferromagnetic exchange coupling occurring between said ferromagnetic film and said magnetic anisotropic magnetoresistive film.

7. The magnetoresistive element of claim 1 wherein said central active area is formed of a magnetoresistive film.

8. The magnetoresistive element of claim 7 wherein said magnetoresistive film includes a spin valve film.

9. The magnetoresistive element of claim 7 wherein said magnetoresistive film includes a ferromagnetic tunnel junction film.

10. The magnetoresistive element of claim 1 wherein said magnetic domain control film of said passive areas includes a hard magnetic film.

11. A thin film magnetic head including a magnetoresistive element comprising:

a central active area; and passive areas provided at two side ends of said central active area, each passive area including a magnetic domain control film and a conductive film;

wherein said magnetic domain control film of each passive area partially overlaps the surface of said central active area, each conductive film is laminated onto a surface of a respective magnetic domain control film and overlaps surfaces of said respective magnetic domain control film and said central active area, and the degree to which said conductive films overlap said surface of said central active area is set larger than the degree to which said magnetic domain control films overlap said surface of said central active area.

12. The thin film magnetic head of claim 11 wherein said degree to which said conductive films overlap the surface of said central active area is uniforn at said two side ends of said central active area.

13. The thin film magnetic head of claim 11 wherein an overlapping area of said conductive films on said surface of said central active area extends beyond respective dead zones formed at said central active area.

14. The thin film magnetic head of claim 13 wherein said respective dead zones extend over approximately 0.15 to 0.5 μm.

15. The thin film magnetic head of claim 11 wherein said central active area includes a magnetic anisotropic magnetoresistive film.

16. The thin film magnetic head of claim 15 wherein said magnetic domain control film of said passive areas includes an anti-ferromagnetic film and applies a longitudinal bias to said magnetic anisotropic magnetoresistive film by utilizing anti-ferromagnetic/ferromagnetic exchange coupling occurring between said ferromagnetic film and said magnetic anisotropic magnetoresistive film.

17. The thin film magnetic head of claim 11 wherein said central active area is formed of a magnetoresistive film.

18. The thin film magnetic head of claim 17 wherein said magnetoresistive film includes a spin valve film.

19. The thin film magnetic head of claim 17 wherein said magnetoresistive film includes a ferromagnetic tunnel junction film.

20. The thin film magnetic head of claim 11 wherein said magnetic domain control film of said passive areas includes a hard magnetic film.

21. The thin film magnetic head of claim 11 wherein said magnetoresistive element is employed as a read element.

22. The thin film magnetic head of claim 21, further comprising:

a write element.

* * * * *